(12) United States Patent
Yamakage et al.

(10) Patent No.: US 11,229,148 B2
(45) Date of Patent: Jan. 18, 2022

(54) COMPONENT MOUNTING MACHINE

(71) Applicant: FUJI CORPORATION, Chiryu (JP)

(72) Inventors: Yusuke Yamakage, Anjo (JP); Yoji Fujita, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 97 days.

(21) Appl. No.: 16/630,716

(22) PCT Filed: Jul. 18, 2017

(86) PCT No.: PCT/JP2017/025959
§ 371 (c)(1),
(2) Date: Jan. 13, 2020

(87) PCT Pub. No.: WO2019/016864
PCT Pub. Date: Jan. 24, 2019

(65) Prior Publication Data
US 2020/0390011 A1    Dec. 10, 2020

(51) Int. Cl.
*B23P 19/00*    (2006.01)
*H05K 13/04*    (2006.01)

(52) U.S. Cl.
CPC ..... *H05K 13/0406* (2018.08); *H05K 13/0408* (2013.01)

(58) Field of Classification Search
CPC ....................... H05K 13/0406; H05K 13/0408
See application file for complete search history.

(56) References Cited

U.S. PATENT DOCUMENTS

| | | | |
|---|---|---|---|
| 4,810,018 A * | 3/1989 | van de Ven | B25J 15/0253 294/198 |
| 9,867,320 B2 * | 1/2018 | Watanabe | H05K 13/0404 |
| 10,334,770 B2 * | 6/2019 | Amano | H04N 5/2254 |
| 10,574,020 B2 * | 2/2020 | Hodges | H01S 3/0407 |
| 11,039,558 B2 * | 6/2021 | Yamakage | H05K 13/086 |
| 2010/0060724 A1 | 3/2010 | Yamauchi et al. | |
| 2015/0047788 A1 * | 2/2015 | Kanda | B65H 35/0026 156/767 |

(Continued)

FOREIGN PATENT DOCUMENTS

EP    1 721 748 A1    11/2006
JP    2008-108951 A    5/2008

OTHER PUBLICATIONS

International Search Report dated Sep. 12, 2017 in PCT/JP2017/025959 filed Jul. 18, 2017, 2 pages.

*Primary Examiner* — Paul D Kim
(74) *Attorney, Agent, or Firm* — Oblon, McClelland, Maier & Neustadt, L.L.P.

(57) ABSTRACT

A component mounting machine that performs mounting of components by moving a mounting head attached to slide using linear motor, stator of the linear motor that is forms of magnets arranged side by side is arranged on base, movable element is fixed to a slide so as to pass through the stator, and bracket for holding a portion of wires for supplying power to the linear motor and wire protector is fixed to the movable element. Since the bracket is located at a position close to the axis line of the movable element, the rotational moment acting on the slide due to the deformation resistance of the wires and the wire protector caused by the movement of the slide is reduced, and appropriate movement of the slide is ensured.

8 Claims, 5 Drawing Sheets

(56) References Cited

U.S. PATENT DOCUMENTS

| | | | |
|---|---|---|---|
| 2015/0223374 A1* | 8/2015 | Nozawa | H05K 3/301 29/739 |
| 2015/0245549 A1* | 8/2015 | Kurita | H05K 13/0812 228/102 |
| 2017/0181341 A1* | 6/2017 | Yamamoto | H05K 13/0409 |
| 2020/0154620 A1* | 5/2020 | Sugita | H05K 13/08 |

* cited by examiner

COMPONENT MOUNTING MACHINE

TECHNICAL FIELD

The present disclosure relates to a component mounting machine for mounting a component, such as an electronic component, to a substrate, such as a circuit board.

BACKGROUND ART

A conventional component mounting machine is configured to mount a component supplied from a component supply device to a substrate held by a substrate holding device, and performs work of mounting the component by moving a mounting head having a component holding device for holding the component between a component supply device and a substrate holding device. The movement of the mounting head is performed by the head moving device that includes, for example, in an XY-robot type head moving device, a moving device for moving the mounting head in one direction and another moving device for moving the mounting head in another direction perpendicular to the first direction. Recently, it has also been considered to employ a linear motor drive device in the moving device, for example, as described in the following patent literature.

CITATION LIST

Patent Literature

Patent literature 1: JP-A-2008-108951

BRIEF SUMMARY

Technical Problem

When employing a linear motor having a coil in the movable element, in order to enable the coil to be energized while the movable element is moving, for example, the component mounting machine described in the above-mentioned document is configured with a bracket established on a slide to which the movable element is attached and a portion of the wires is held on the bracket. When the slide moves while dragging the wires, a resistive load is generated by the wires. The resistive load imparts a rotational moment to the slide, which may interfere with appropriate movement of the slide. That is, considering the rotational moment applied to the slide due to the resistive load of the wires, the practicality of the component mounting machine can be improved. An object of the present disclosure is to provide a highly practical component mounting device that takes account of the above circumstances.

Solution to Problem

To solve the above problems, disclosed herein is a component mounting machine including:
  a substrate holding device configured to hold a substrate;
  a component supply device configured to supply a component;
  a mounting head configured to pick up and hold the component supplied from the component supply device and mount the component on the substrate held by the substrate holding device; and
  a moving device configured to move the mounting head, the moving device including a unidirectional moving device configured to move the mounting head in a first direction using a linear motor,
wherein
the unidirectional moving device is provided with
a base,
a pair of guide rails arranged on the base extending parallel in the first direction, a slide configured to hold the mounting head, the slide being guided by the pair of guide rails and movable in the first direction,
a stator that configures the linear motor, the stator being held on the base with multiple magnets that are lined up in the first direction,
a movable element that configures the linear motor, the movable element including a coil and being arranged on the slide between the pair of guide rails, and
a bracket fixed to the movable element and configured to hold a portion of wires that are used to supply power to the linear motor.

Note that, here "bracket" refers to an arm or crossarm, for example, a supporting tool used in a case of supporting item B on item A, wherein one end of the tool is attached to item A and item B is supported by the other end.

Advantageous Effects

In a component mounting machine of the present disclosure, a bracket for holding a portion of the above wires is attached to a movable element. That is, the wires are supported by the bracket at a position relatively close to the movable element, therefore, according to a component mounting machine of the present disclosure, the rotational moment applied to the slide on which the movable element is arranged is reduced, thus ensuring appropriate displacement of the slide.

DESCRIPTION OF EMBODIMENTS

Figure 1:
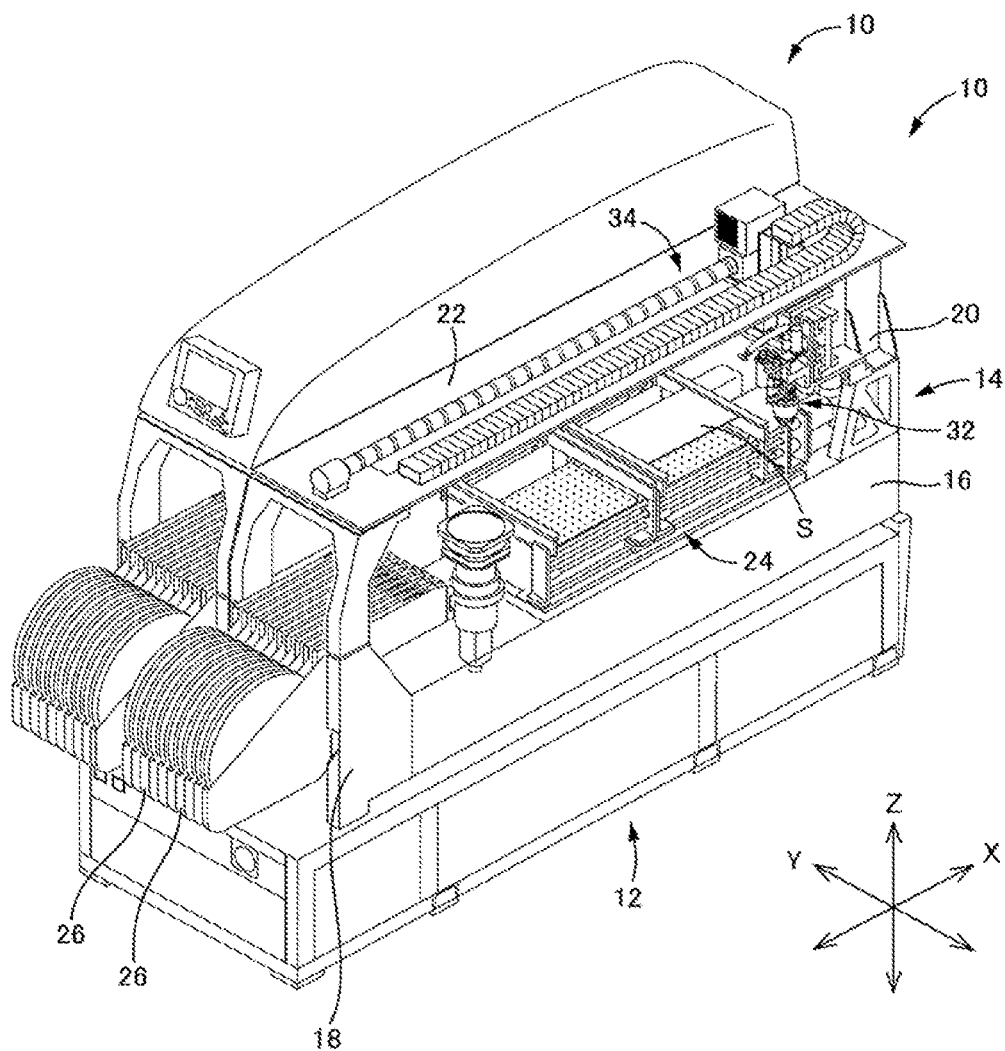
FIG. 1 is a perspective view showing the entire configuration of a component mounting machine of an embodiment.

Hereinafter, an embodiment of a component mounting machine of the present disclosure will be described in detail by referring to the drawings. Note that, in addition to the following embodiments, a component mounting machine of the present disclosure can be realized in various forms with changes or improvements implemented based on knowledge of someone skilled in the art.

First Embodiment

In a component mounting machine of an embodiment, an electronic circuit component (hereinafter, also referred to as a "component") as a component is mounted on a circuit board (hereinafter, also referred to as a "board") as a substrate, and the entire component mounting machine is shown in FIG. 1. FIG. 1 shows a system in which two component mounting machines 10 are arranged on system base 12. Note that, one of the two component mounting machines 10 is shown with the outer cover removed. Also, as shown in the figure, in the following description, the front-rear direction is also referred to as the X direction, the left-right direction is also referred to as the Y direction, and the vertical direction is also referred to as the Z direction.

Component mounting machine 10 has main frame 14, with main frame 14 including base 16, front support column 18 and rear support column 20 established at the front and rear of base 16, and upper frame 22 mounted on front support column 18 and rear support column 20 so as to be arranged above component mounting machine 10. Arranged on base 16 are board holding device 24 that functions as a substrate holding device for holding board S, and multiple component feeders 26 that each function as a component supply device to sequentially supply tape components. Board holding device 24 is configured mainly of a conveyor, and has a function of conveying boards S in the Y direction in two lanes.

Figure 2:
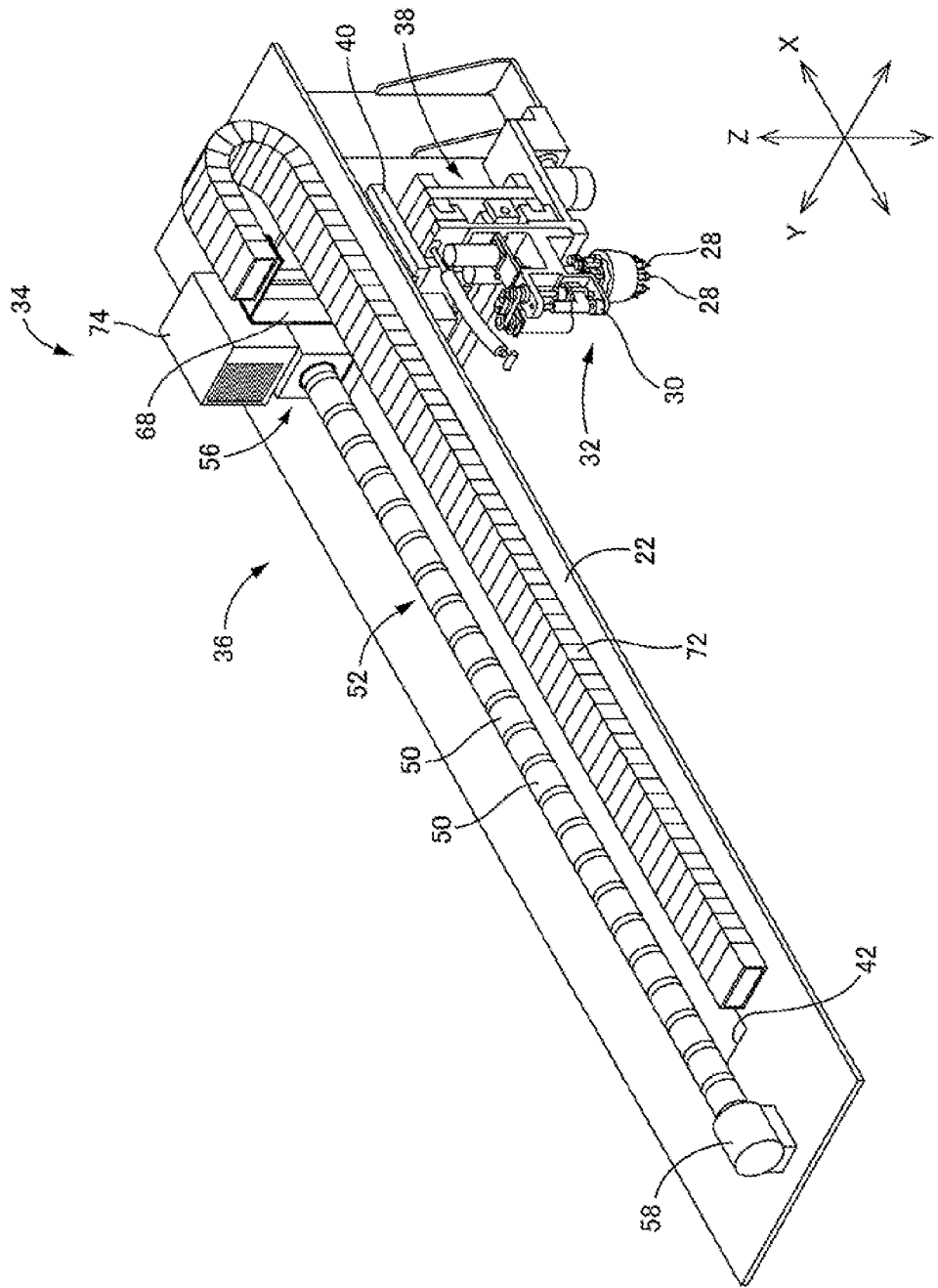
FIG. 2 is a perspective view of a mounting head of the component mounting machine of the embodiment and a moving device that moves the mounting head.

Components supplied from component feeder 26 are mounted on board S held by board holding device 24, the mounting work being performed by mounting head 32 that includes suction nozzle 28, which is a component holding device, and nozzle raising and lowering device 30 that moves suction nozzle 28 in the Z direction (see FIG. 2). Component mounting machine 10 includes head moving device 34 for moving mounting head 32 along a horizontal plane (XY plane).

Head moving device 34 includes: X-direction moving device 36, which is a unidirectional moving device for moving the mounting head 32 in the X direction; and Y direction moving device 38, which is a unidirectional moving device for moving mounting head 32 in the Y direction. X-direction moving device 36 moves X slide 40 in the X direction, and Y-direction moving device 38 is held by X slide 40. To describe Y-direction moving device 38 briefly, a base plate that is a foundational body is fixed to X slide 40, and a Y slide holding mounting head 32 is moved in the Y direction with respect to the X slide 40 by a moving mechanism including a driving motor, a ball screw mechanism, a linear guide, and the like.

Figure 3:
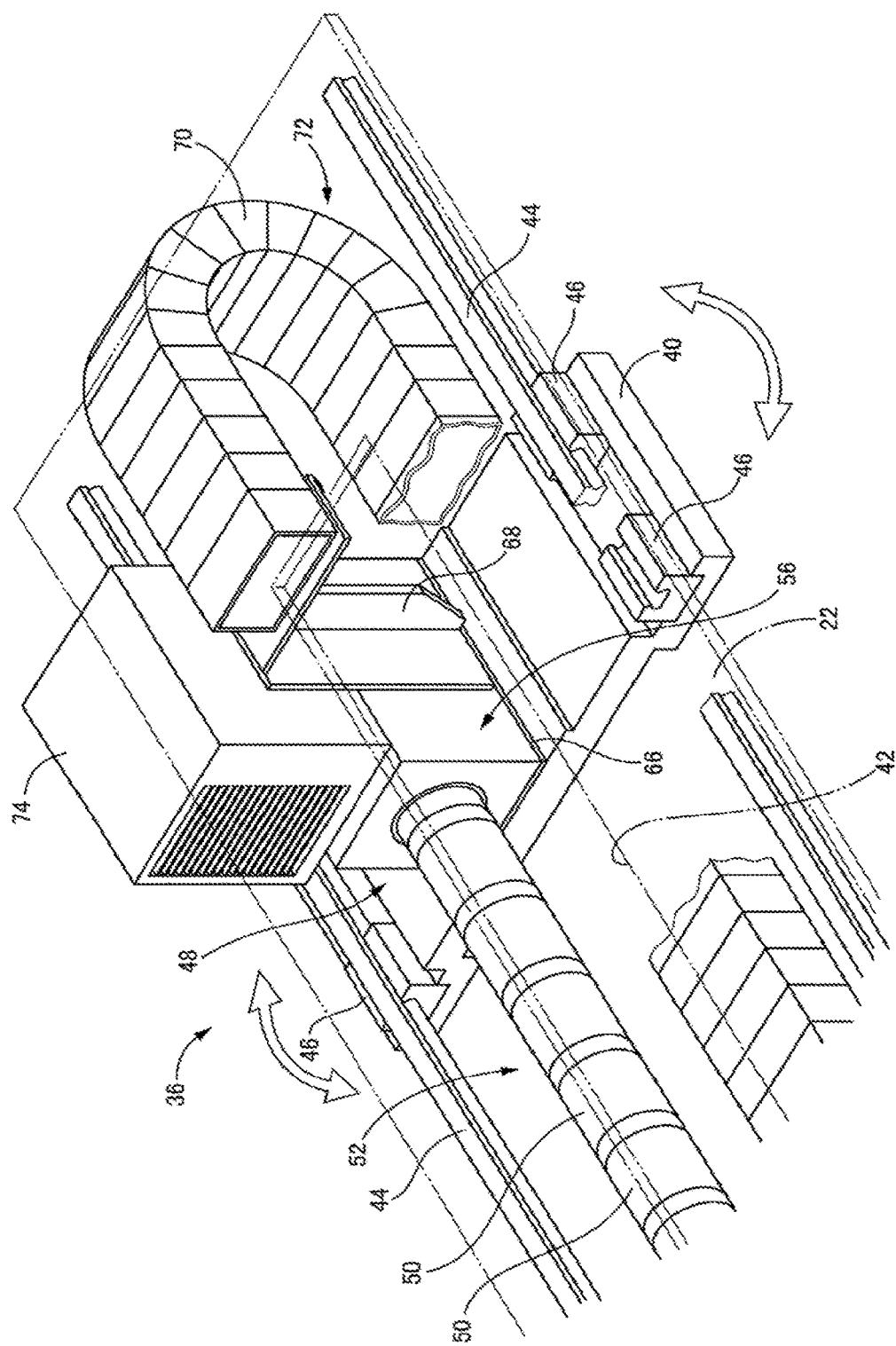
FIG. 3 is a perspective view showing a main section of an X-direction moving device constituting a moving device in the component mounting machine of the embodiment.
Figure 4:
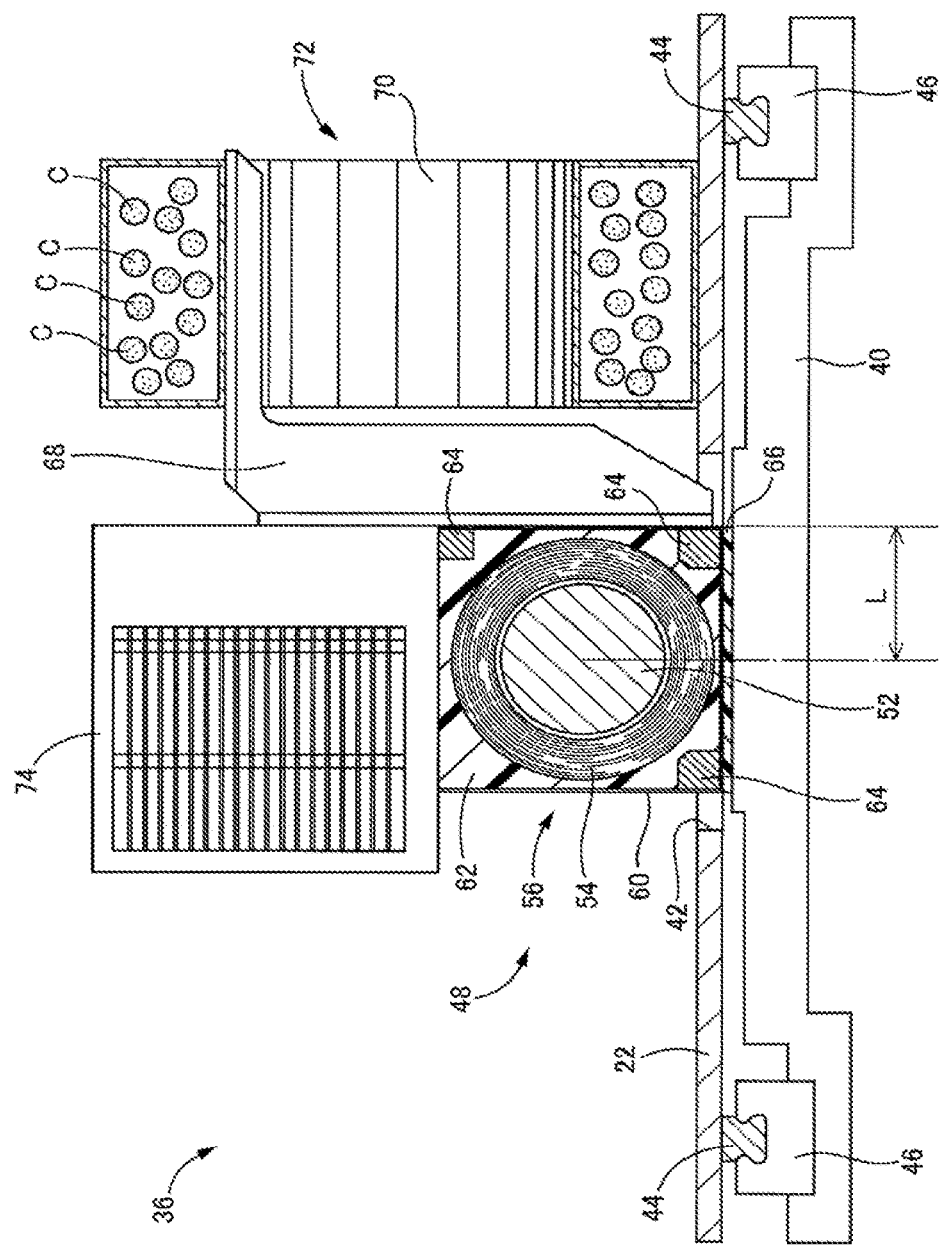
FIG. 4 is a partial cross section front view of the X-direction moving device constituting a moving device in the component mounting machine of the embodiment.

X-direction moving device 36 is a linear motor drive moving device, and to describe based on FIGS. 3 and 4 that show the main parts, upper frame 22 functions as a base of X-direction moving device 36. Note that, in FIG. 3, upper frame 22 is shown by a two-dot broken line, and has a generally frame shape with opening 42 extending in the X direction at the center. Pair of guide rails 44, which are parallel to each other, are laid so as to extend in the X direction on a lower surface of upper frame 22. Fixed to X slide 40 is slider unit 46 that engages with each of the pair of guide rails 44 via ball bearings, and X slide 40 is guided by the pair of guide rails 44 so as to be movable in the X-direction under upper frame 22. Guide rail 44 and slider unit 46 constitute a so-called linear guide.

Linear motor 48 serving as the drive source of X-direction moving device 36 is a so-called shaft motor, and includes shaft-type stator 52 in which multiple magnets 50 are arranged in the X direction, and movable element 56 having a three-phase coil 54 and arranged so as to allow stator 52 to pass through coil 54. Stator 52 is integrated such that adjacent magnets of the multiple magnets 50 have the same poles facing each other, and is held by upper frame 22 at both ends via holding tube 58 fixed to an upper surface of upper frame 22.

Movable element 56 has coils 54 inside thin metal housing 60 an upper section of which is open, and in X-direction moving device 36, stator 52 is configured to penetrate movable element 56 in the X direction, which is the moving direction of movable element 56. Housing 60 is filled with resin 62 so as to embed coil 54 together with three support bars 64, each of which is a metal bar. Movable element 56 is fixedly arranged on top of X slide 40 between the pair of guide rails 44. Note that, between X slide 40 and movable element 56, more specifically, between X slide 40 and the lower surface which is one of the outer surfaces of movable element 56 fixed to X slide 40, insulation sheet 66, which is an insulation material, is interposed, so as to curtail the effect of heat generated by movable element 56 on the mounting head 32 side. In addition, although not shown in the drawings, movable element 56 is fixed to X slide 40 by bolts using tapped holes provided on two support bars 64 provided on the lower portion.

In X-direction moving device 36, bracket 68 for fixing a portion of the wires for supplying power to linear motor 48, that is, for supplying power to coils 54 of movable element 56, is fixed directly to movable element 56, in particular, directly to the right side surface of movable element 56. Note that, bracket 68 has a generally angled shape, that is, an L-shape, and is attached to movable element 56 at a portion that forms one length of the L-shape, and a portion of the wires is fixed to a portion that forms the other length of the L-shape. In detail, bracket 68 is attached to movable element 56 so as to project upward from upper frame 22 through opening 42 of upper frame 22 from between the pair of guide rails 44.

More specifically, as shown in FIG. 4, wires C include not only a wire for supplying power to linear motor 48 but also a wire for supplying power to mounting head 32, and the wires C are covered by a wire protector (so-called Cableveyor [registered trademark]) 72 serving as a wire retainer in which curved section 70 is displaced in the X direction as movable element 56 moves in the X direction. One end section of wire protector 72 is fixed to bracket 68, and via that end section, a portion of wires C, more specifically, and end section on the side connected to the lead wires extending from mounting head 32 or movable element 56 are fixed to bracket 68. The other end section of wire protector 72 is fixed to the upper surface of main frame 22, and the portion connected to the other end section thereof extends in the X direction to the upper surface of main frame 22. Note that, in FIGS. 3 and 4, connections between wires C and movable element 56 or mounting head 32 are not shown. Further, although not shown, bracket 68 is fixed to movable element 56 by bolts using tapped holes provided on two support bars 64 provided on the right side.

Also, cooling device 74 that cools movable element 56 and is configured including fins is provided on the upper surface of movable element 56. In other words, movable element 56 has four outer surfaces around its own axis parallel to the X direction, which is the moving direction, so as to form a substantially rectangular parallelepiped, and is provided with cooling device 74 on an outer surface different from the outer surface fixed to X slide 40 and the outer surface to which bracket 68 is fixed, such that bracket 68 and cooling device 74 are efficiently arranged. Bracket 68 is made of a material having good thermal conductivity, more specifically, an aluminum alloy, and bracket 68 itself contributes to cooling of movable element 56.

With X-direction moving device 36, when X slide 40 is moved in the X direction by linear motor 48, X slide 40 is moved so as to pull wires C, a portion of which are fixed.

This pulling, more specifically, the deformation resistance of the wires C in accordance with the pulling, becomes a resistance to the movement of X slide 40. With X-direction moving device 36, wires C are covered by wire protector 72, and a large resistance is generated against the movement of X slide 40 by adding the deformation resistance of the wire protector.

Figure 5:
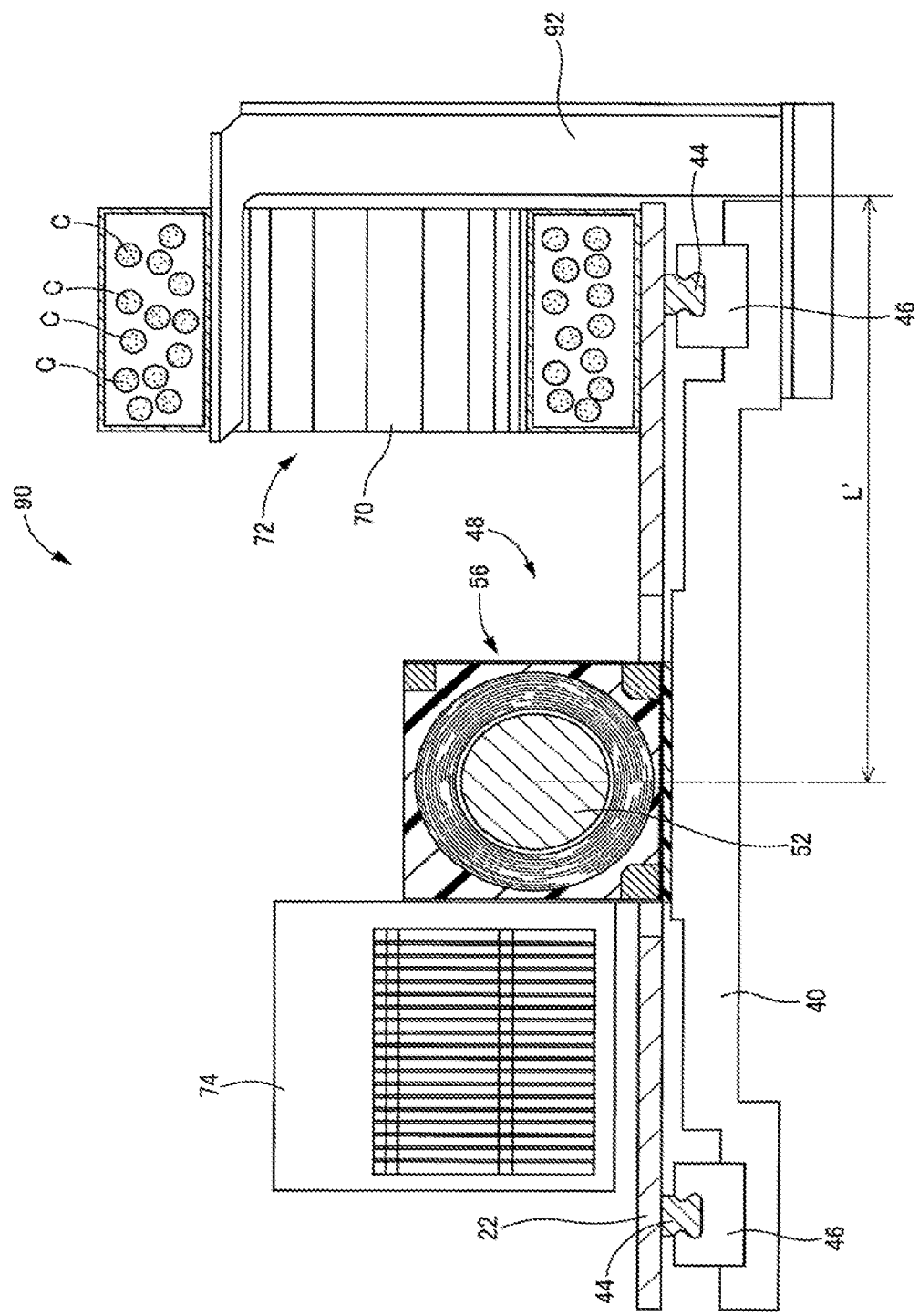
FIG. 5 is a partial cross section front view showing a conventional X-direction moving device.

FIG. 5 is a conventional X-direction moving device 90, in which bracket 92 is mounted upright on X slide 40 on the exterior side of the pair of guide rails 44. In other words, in X-direction moving device 90, X slide 40 is established at a position distance L' to the right side from the center, that is, the axis line of movable element 56. In a case in which a portion of wires C, that is, wire protector 72, is held on bracket 92 established separated by relatively large distance L', when X slide 40 moves, due to the resistance mentioned above, a relatively large rotational moment in the horizontal plane, specifically, a yaw moment (a moment indicated by white arrows in FIG. 3) acts on X slide 40. This large rotational moment also affects, for example, the accuracy of the mounting operation by mounting head 32, so that it is desirable to minimize the rotational moment as much as possible.

With X-direction moving device 36 of the present component mounting machine 10, as shown in FIG. 4, bracket 68 is directly fixed to movable element 56 without X-slide 40 interposing. That is, bracket 68 is positioned a relatively small distance L from the axis line in the horizontal direction. Accordingly, the rotational moment acting on X slide 40 is small, and appropriate movement of the X slide is ensured. Note that, in a case in which it is not desirable to transfer heat from movable element 56 to bracket 68, bracket 68 may be fixed to movable element 56 via insulation material.

REFERENCE SIGNS LIST

10: component mounting device;
22: upper frame (base);
24: board holding device (substrate holding device);
26: component feeder (component supply device);
32: mounting head;
34: head moving device;
36: X-direction moving device (unidirectional moving device);
40: X slide;
44: guide rail;
48: linear motor;
50: magnet;
52: stator;
54: coil;
56: movable element;
66: insulation sheet (insulation material);
68: bracket;
70: curved section;
72: wire protectors;
74: cooling device;
90: X-direction moving device;
92: bracket;
S: board (substrate);
C: wire

The invention claimed is:

1. A component mounting machine comprising:
a conveyor configured to hold a substrate;
a component feeder configured to supply a component;
a mounting head configured to pick up and hold the component supplied from the component feeder and mount the component on the substrate held by the conveyor; and
a moving device configured to move the mounting head, the moving device including a unidirectional moving device configured to move the mounting head in a first direction using a linear motor, wherein
the unidirectional moving device is provided with
a base,
a pair of guide rails arranged on the base extending parallel in the first direction,
a slide configured to hold the mounting head, the slide being guided by the pair of guide rails and movable in the first direction,
a stator that configures the linear motor, the stator being held on the base with multiple magnets that are lined up in the first direction,
a movable element that configures the linear motor, the movable element including a coil and being arranged on the slide between the pair of guide rails,
a bracket fixed to the movable element and configured to hold a portion of wires that are used to supply power to the linear motor, and
wires held by a wire retainer configured to cover the wires and provided with a curved section that is configured to be displaced in the first direction in accordance with a movement of the movable element, wherein an end section of the wire retainer is fixed to the bracket and another end section of the wire retainer is fixed to the base.

2. The component mounting machine according to claim 1, wherein
the linear motor is configured such that the stator penetrates the movable element in the first direction.

3. The component mounting machine according to claim 1, wherein
the bracket is made of aluminum alloy.

4. The component mounting machine according to claim 1, wherein
the bracket is configured to also hold a portion of wires for powering the mounting head.

5. A component mounting machine comprising:
a conveyor configured to hold a substrate;
a component feeder configured to supply a component;
a mounting head configured to pick up and hold the component supplied from the component feeder and mount the component on the substrate held by the conveyor; and
a moving device configured to move the mounting head, the moving device including a unidirectional moving device configured to move the mounting head in a first direction using a linear motor, wherein
the unidirectional moving device is provided with
a base,
a pair of guide rails arranged on the base extending parallel in the first direction,
a slide configured to hold the mounting head, the slide being guided by the pair of guide rails and movable in the first direction,
a stator that configures the linear motor, the stator being held on the base with multiple magnets that are lined up in the first direction,
a movable element that configures the linear motor, the movable element including a coil and being arranged on the slide between the pair of guide rails, and a bracket fixed to the movable element and configured to hold a portion of wires that are used to supply power to the linear motor, wherein the unidirectional moving device is configured such that the base is arranged on an upper section of the component mounting machine and the unidirectional moving device is configured to move the mounting head in a horizontal direction, the slide is configured such that the movable element is fixed to an upper section of the slide, and the slide is movable in the first direction below the base, and the bracket is fixed to the movable element in a manner protruding from the base upwards from between the pair of guide rails.

6. A component mounting machine comprising:

a conveyor configured to hold a substrate;

a component feeder configured to supply a component;

a mounting head configured to pick up and hold the component supplied from the component feeder and mount the component on the substrate held by the conveyor; and a moving device configured to move the mounting head, the moving device including a unidirectional moving device configured to move the mounting head in a first direction using a linear motor, wherein the unidirectional moving device is provided with a base, a pair of guide rails arranged on the base extending parallel in the first direction, a slide configured to hold the mounting head, the slide being guided by the pair of guide rails and movable in the first direction, a stator that configures the linear motor, the stator being held on the base with multiple magnets that are lined up in the first direction, a movable element that configures the linear motor, the movable element including a coil and being arranged on the slide between the pair of guide rails, and a bracket fixed to the movable element and configured to hold a portion of wires that are used to supply power to the linear motor, wherein the movable element has multiple outer surfaces about its own axis parallel to the first direction, one of the multiple outer surfaces being fixed to the slide, and another of the multiple outer surfaces being fixed to the bracket.

7. The component mounting machine according to claim 6, wherein an insulation material is interposed between the slide and the one of the multiple outer surfaces fixed to the slide.

8. The component mounting machine according to claim 6, wherein the movable element includes three or more outer surfaces as the multiple outer surfaces, and a cooling device configured to cool the movable element is provided on one of the three or more outer surfaces different from an outer surface fixed to the slide and an outer surface to which the bracket is fixed.

* * * * *